(12) United States Patent
Birner et al.

(10) Patent No.: US 10,074,721 B2
(45) Date of Patent: Sep. 11, 2018

(54) METHOD OF FABRICATING A SEMICONDUCTOR WAFER THAT INCLUDES PRODUCING A PLANARISED SURFACE HAVING BOTH A MESA SURFACE AND AN INSULATING LAYER SURFACE

(71) Applicant: Infineon Technologies AG, Neubiberg (DE)

(72) Inventors: Albert Birner, Regensburg (DE); Helmut Brech, Lappersdorf (DE); Simone Lavanga, Faak am See (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/273,231

(22) Filed: Sep. 22, 2016

(65) Prior Publication Data
US 2018/0083107 A1    Mar. 22, 2018

(51) Int. Cl.
| H01L 21/304 | (2006.01) |
| H01L 29/205 | (2006.01) |
| H01L 29/20 | (2006.01) |
| H01L 21/02 | (2006.01) |
| H01L 21/3105 | (2006.01) |
| H01L 21/762 | (2006.01) |
| H01L 29/778 | (2006.01) |
| H01L 29/66 | (2006.01) |

(52) U.S. Cl.
CPC ........ H01L 29/205 (2013.01); H01L 21/0254 (2013.01); H01L 21/304 (2013.01); H01L 21/31053 (2013.01); H01L 21/31056 (2013.01); H01L 21/76229 (2013.01); H01L 29/2003 (2013.01); H01L 21/02378 (2013.01); H01L 21/02381 (2013.01); H01L 21/02433 (2013.01); H01L 29/66462 (2013.01); H01L 29/778 (2013.01)

(58) Field of Classification Search
CPC ......... H01L 21/02318; H01L 21/02389; H01L 21/0254; H01L 21/304; H01L 21/31053; H01L 21/31056; H01L 21/461; H01L 21/463; H01L 21/467; H01L 21/8258; H01L 29/2003; H01L 29/205; H01L 29/66431; H01L 29/66462; H01L 29/778
See application file for complete search history.

(56) References Cited

U.S. PATENT DOCUMENTS

| 5,378,316 A | 1/1995 | Franke et al. |
| 5,431,775 A | 7/1995 | Prince et al. |

(Continued)

FOREIGN PATENT DOCUMENTS

GB    2275129 A    8/1994

*Primary Examiner* — Stephen W Smoot
(74) *Attorney, Agent, or Firm* — Murphy, Bilak & Homiller, PLLC

(57) ABSTRACT

In an embodiment, a method of planarizing a surface includes applying a first layer to a surface including a protruding region such that the first layer covers the surface and the protruding region, removing a portion of the first layer above the protruding region and forming an indentation in the first layer above the protruding region, the protruding region remaining covered by material of the first layer, and progressively removing an outermost surface of the first layer to produce a planarised surface.

13 Claims, 9 Drawing Sheets

(56) References Cited

U.S. PATENT DOCUMENTS

| | | | |
|---|---|---|---|
| 5,498,565 | A | 3/1996 | Gocho et al. |
| 5,643,836 | A * | 7/1997 | Meister ............ H01L 21/31055 257/E21.245 |
| 5,958,795 | A | 9/1999 | Chen et al. |
| 5,961,794 | A | 10/1999 | Morita et al. |
| 5,998,279 | A | 12/1999 | Liaw et al. |
| 6,004,863 | A | 12/1999 | Jang et al. |
| 6,057,207 | A | 5/2000 | Lin et al. |
| 6,103,592 | A | 8/2000 | Levy et al. |
| 6,107,187 | A | 8/2000 | Lao et al. |
| 6,140,224 | A | 10/2000 | Lin et al. |
| 6,171,896 | B1 | 1/2001 | Jang et al. |
| 6,365,523 | B1 | 4/2002 | Jang et al. |
| 6,372,605 | B1 | 4/2002 | Kuehne et al. |
| 6,528,389 | B1 | 3/2003 | Allman et al. |
| 6,869,858 | B2 | 3/2005 | Jang et al. |
| 7,164,837 | B2 | 1/2007 | Kang et al. |
| 2002/0004284 | A1 | 1/2002 | Chen et al. |
| 2002/0055258 | A1 | 5/2002 | Nakasato |
| 2002/0094493 | A1 | 7/2002 | Chen et al. |
| 2003/0151020 | A1 | 8/2003 | Lee et al. |
| 2003/0153135 | A1 * | 8/2003 | Kim .................... H01L 23/5258 438/132 |
| 2003/0194848 | A1 * | 10/2003 | Jang .................. H01L 21/31053 438/424 |
| 2008/0210977 | A1 | 9/2008 | Okita |
| 2009/0146186 | A1 | 6/2009 | Kub et al. |
| 2012/0107646 | A1 | 5/2012 | Rawat et al. |
| 2012/0146134 | A1 | 6/2012 | Kamada et al. |
| 2013/0052784 | A1 * | 2/2013 | Sugioka ............ H01L 21/31053 438/381 |
| 2014/0054596 | A1 | 2/2014 | Ritenour et al. |
| 2014/0061659 | A1 | 3/2014 | Teplik et al. |
| 2015/0349105 | A1 | 12/2015 | Curatola et al. |
| 2016/0099309 | A1 | 4/2016 | Derluyn et al. |

* cited by examiner

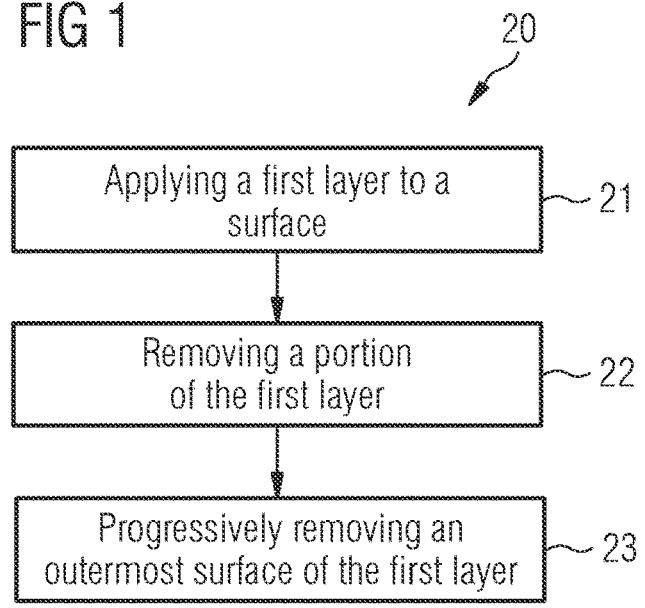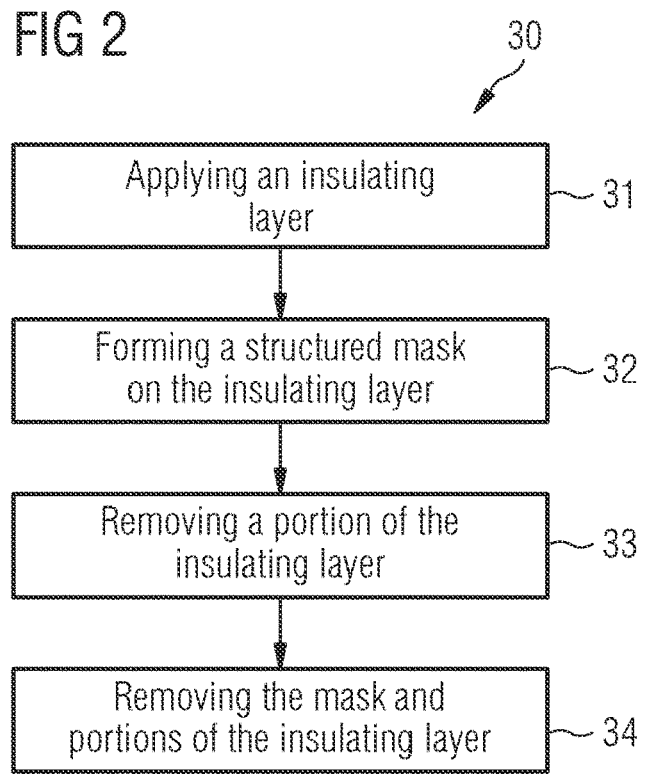

METHOD OF FABRICATING A SEMICONDUCTOR WAFER THAT INCLUDES PRODUCING A PLANARISED SURFACE HAVING BOTH A MESA SURFACE AND AN INSULATING LAYER SURFACE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large current densities, support high breakdown voltages and to provide very low on-resistance, ultra-fast switching times and improved power efficiency.

SUMMARY

In an embodiment, a method of planarising a surface includes applying a first layer to a surface including a protruding region such that the first layer covers the surface and the protruding region, removing a portion of the first layer above the protruding region and forming an indentation in the first layer above the protruding region, the protruding region remaining covered by material of the first layer, and progressively removing an outermost surface of the first layer to produce a planarised surface.

In an embodiment, a method of fabricating a semiconductor wafer includes depositing an insulating layer onto a substrate including at least one mesa including at least one Group III nitride such that an upper surface of the substrate and the mesa are covered with the insulating layer, forming a structured mask on the insulating layer having an opening above the mesa, the opening having a lateral area smaller than a lateral area of the mesa, removing a portion of the insulating layer within the opening and reducing a thickness of the insulating layer arranged above the mesa, and removing the mask and portions of the insulating layer to produce a planarised surface including a surface of the mesa and a surface of the insulating layer.

In an embodiment, a semiconductor wafer includes a substrate wafer including a device surface region surrounded by a peripheral region, one or more mesas including a Group III nitride layer arranged on the device surface region and an oxide layer arranged on the device surface region and on the peripheral region, the oxide layer having an upper surface that is substantially coplanar with an upper surface of the mesas.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1 illustrates a flow chart of a method of planarising a surface.

FIG. 2 illustrates a flow chart of a method of planarising a surface.

DETAILED DESCRIPTION

Figure 3:
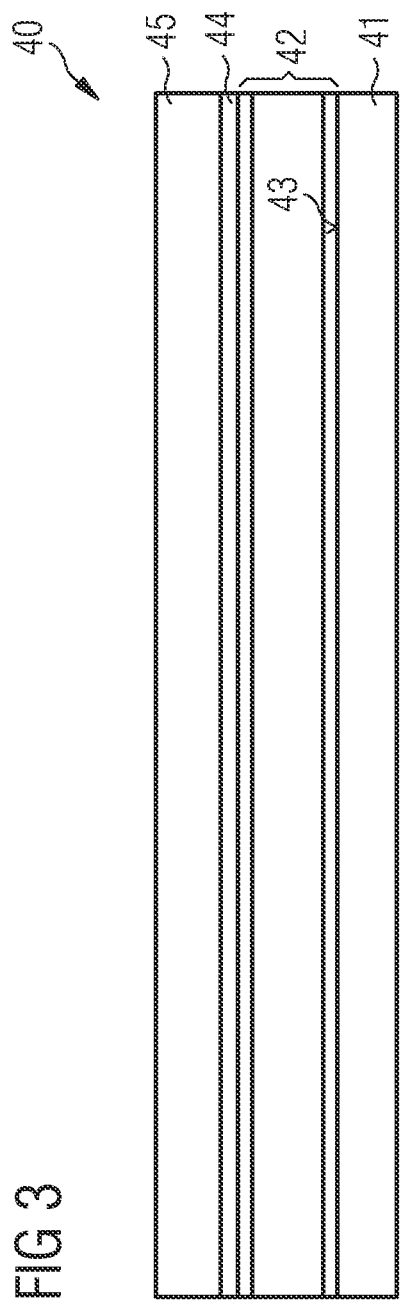
FIG. 3 illustrates a substrate including a semiconductor structure, passivation layer and sacrificial layer.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

FIG. 1 illustrates a flow chart 20 of a method of planarising a surface. In box 21, a first layer is applied to a surface including at least one protruding region such that the first layer covers the surface and the protruding region.

In box 22, a portion of the first layer arranged above the protruding region is removed and an indentation in the first layer above the protruding region is formed. The protruding region remains covered by material of the first layer.

In box 23, an outermost surface of the first layer is progressively removed to produce a planarised surface.

The surface including the at least one protruding region may be the surface of a substrate for supporting the fabrication of semiconductor devices. The substrate may be a wafer such as a single crystal silicon wafer, silicon carbide wafer, or a sapphire wafer.

The protruding region may include one or more semiconductor materials, for example one or more compound semiconductors such as one or more Group III nitride layers. The material of the protruding region may differ from material of the underlying substrate. Each of the protruding regions may include structures suitable for fabricating a semiconductor device, such as a transistor device. The planarised surface resulting from the use of the method may be used to support the subsequent deposition of a metallisation structure for the semiconductor devices onto the planarised surface.

The planarised surface may include an outer surface of the protruding region and an outer surface of the first layer so that the first layer is completely removed from an upper surface of the protruding region.

The first layer may include an insulating material such as an oxide, for example the silicon oxide, and be of a different composition from the composition of the protruding region and the composition of the substrate.

The planarised surface may be formed by progressively removing the outermost surface of the first layer until all of the material of the first layer positioned above the protruding region is removed and such that the outer surface of the first layer in regions adjacent the protruding region is substantially coplanar with the outer surface of the protruding region. This method may be carried out by chemical mechanical polishing.

Chemical mechanical polishing is a method in which the surface is ground or polished with use of a slurry having a composition including particles to remove material by mechanical or abrasive polishing and components selected to remove material by chemical reaction, for example by etching. The composition of the slurry may also define the selectivity to other materials, for example so called landing pads.

The first layer is planarised in two stages. In a first stage, portions of the first layer are selectively removed from regions above the protruding region to produce an indentation such that the thickness of the first layer above the protruding region is less than in regions adjacent the protruding region. In some embodiments, the thickness of the portion of the first layer arranged above the protruding region is reduced by 80% to 90% of the initial thickness of the first layer above the protruding region. The indentation in the first layer is surrounded by a wall of material of the first layer. The protruding region remains covered by material of the first layer after the second stage of the planarization process.

In some embodiments, the indentation has a lateral area which is less than the lateral area of the protruding region and may be positioned such that the edges of the protruding region are covered with a portion of the first layer having greater thickness than the central portion of the protruding region.

The indentation in the first layer above the protruding region may be formed by applying a structured mask to the first layer having an opening above the protruding region.

The structured mask together with the first layer may provide a protrusion at edges of the upper surface of the protruding region.

The portions of the first layer may be selectively removed from regions above the protruding region such that the base of the resulting indentation lies in a plane that is spaced at substantially the same distance from the surface or further from the surface than the upper surface of regions of the first layer that are arranged laterally adjacent and laterally spaced apart from the protruding regions.

In a second stage, the outer most surface of the first layer is removed, in particular, progressively removed over the entire surface of the substrate so that the underlying upper surface of the protruding region is revealed. The underlying upper surface of the protruding region lies in a plane that is substantially coplanar with a plane in which the outer surface of the first layer in regions adjacent the protruding region lies.

This selective removal of portions of the first layer above the protruding region before chemical mechanical polishing the entire area of the first layer assists in providing a well planarised surface, for example a planarised surface having a reduced height difference between the protruding regions and the first layer which surrounds side faces of the protruding region.

This two stage planarization method may also be repeated one or more times by depositing a second layer, forming second indentations above the protruding regions and performing a further chemical mechanical polishing process to produce a planarised surface.

FIG. 2 illustrates a flow chart 30 of the method for fabricating a semiconductor wafer. In box 31, an insulating layer is deposited onto a substrate including at least one mesa that includes at least one compound semiconductor such that an upper surface of the substrate and the at least one mesa are covered with the insulating layer.

The compound semiconductor may be include at least one Group III nitride semiconductor material and may include two or more epitaxial Group III nitride layers arranged in a stack. The mesa may include a stack of Group III nitride layer for a semiconductor device, such as a transistor device, for example a High Electron Mobility Transistor (HEMT).

In box 32, a structured mask is formed on the insulating layer which has an opening above the mesa. The opening has a lateral area smaller than the lateral area of the mesa.

In box 33, a portion of the insulating layer within the opening is removed to reduce a thickness of the insulating layer above the mesa. In some embodiments, an indentation is formed in the insulating layer above the mesa such that the mesa remains covered by the insulating layer. The indentation may be defined by walls of the insulating layer.

In box 34, the mask and portions of the insulating layer are removed to produce a planarised surface including a surface of the mesa and a surface of the insulating layer.

The mask and portions of the insulating layer may be removed to produce a planarised surface by progressive removal of the mask and the insulating layer, for example by chemical mechanical polishing.

The insulating layer may include an oxide, such as a silicon oxide which may be deposited using plasma enhanced Chemical Vapour Deposition (CVD) or Physical Vapour Deposition (PVD), for example.

The mesa may have dimensions suitable for forming a semiconductor device, such as a transistor device. The substrate may include a semiconductor wafer having a surface capable of supporting the epitaxial growth of one or more Group III nitride layers. Each mesa may include a structure suitable for forming a semiconductor device. For example, to form a Group III nitride-based transistor device such as a High Electron Mobility Transistor (HEMT), each mesa may include a transition or buffer structure arranged on the upper surface of the substrate, a channel layer arranged on the transition structure and a barrier layer arranged on the channel layer, whereby the channel layer and the barrier layer include Group III nitride-based materials of differing bandgap such that a heterojunction is formed between the barrier layer and the channel which is capable of supporting a two-dimensional charge gas produced by piezoelectric and spontaneous polarization. In some embodiments, the channel layer includes gallium nitride and the barrier layer includes aluminium gallium nitride ($Al_xGa_{(1-x)}N$, where $0<x<1$).

The structured mask may include a photosensitive material so that the mask can be formed by photolithographic techniques.

The mesa may be formed by first depositing a selected semiconductor structure continuously over the upper surface of the substrate and removing regions of this layer to produce the at least one mesa protruding from the upper surface of the substrate. The upper surface material of the substrate may be exposed in regions adjacent the mesa. In some embodiments, the outermost surface of the substrate is removed in regions adjacent the mesas so that the mesas are arranged on raised regions of the substrate.

In order to form the mesas from the continuous layer, a stop layer may be applied to the upper Group III nitride layer. The stop layer may be provided by a passivation layer such as silicon nitride layer. A sacrificial layer may be applied to the stop layer and a structured mask applied to the sacrificial layer which has openings. The mask is positioned on portions of the continuous layer which are to form the mesas.

The sacrificial layer is removed from areas exposed by the mask, i.e. the areas exposed in the openings of the mask. In some embodiments the mask is removed and the remaining portions of the sacrificial layer may be used as a mask during the removal of the exposed portions of the stop layer and Group III nitride layer to form at least one protruding region or mesa on the surface of the substrate including the Group III nitride layer which is topped by the sacrificial layer. The remaining portions of the sacrificial layer may be removed from the mesas. The mesas may include a Group III nitride multilayer structure for a device such as a transistor device which is topped by a passivation layer which forms part of the final device structure.

An example of a method for fabricating a semiconductor wafer with semiconductor mesas embedded in an insulating matrix and a planarised surface will now be described with reference to FIGS. 3 to 9.

FIGS. 3 to 6 illustrate embodiments for fabricating a semiconductor wafer including a plurality of mesas including a semiconductor structure arranged on a substrate.

FIG. 3 illustrates a cross-sectional view of a portion of a semiconductor wafer 40 including a substrate 41, a Group III nitride-based semiconductor structure 42 arranged on an upper surface 43 of the substrate 41, a passivation layer 44 arranged on the upper surface of the Group III nitride-based semiconductor structure 42 and an insulating layer 45 arranged on the passivation layer 44. The Group III nitride-based semiconductor structure 42, passivation layer 44 and insulation layer 45 may be continuously deposited on the upper surface 43 of the substrate 41.

The substrate 41 may include a single crystal wafer having an upper surface 43 capable of supporting the epitaxial growth of one or more Group III nitride layers. The substrate 41 may include a silicon wafer, for example a <111> or <100> silicon wafer, sapphire or silicon carbide. The Group III nitride-based semiconductor structure 42 may include a buffer structure arranged on the upper surface 43, a gallium nitride (GaN) channel layer arranged on the buffer structure and an aluminium gallium nitride ($Al_xGa_{(1-x)}N$, where $0<x<1$) channel layer arranged on the buffer layer. A heterojunction is formed between the channel layer and the barrier layer which is capable of supporting a two-dimensional charge gas, such as two-dimensional electron gas (2DEG) or two-dimensional hole gas (2DHG). The passivation layer 44 may include silicon nitride and may be arranged on the barrier layer. However, the Group III nitride-based semiconductor structure 42 may not limited to this arrangement and may have other arrangements. The insulating layer 45 may include an oxide such as silicon oxide.

Figure 4:
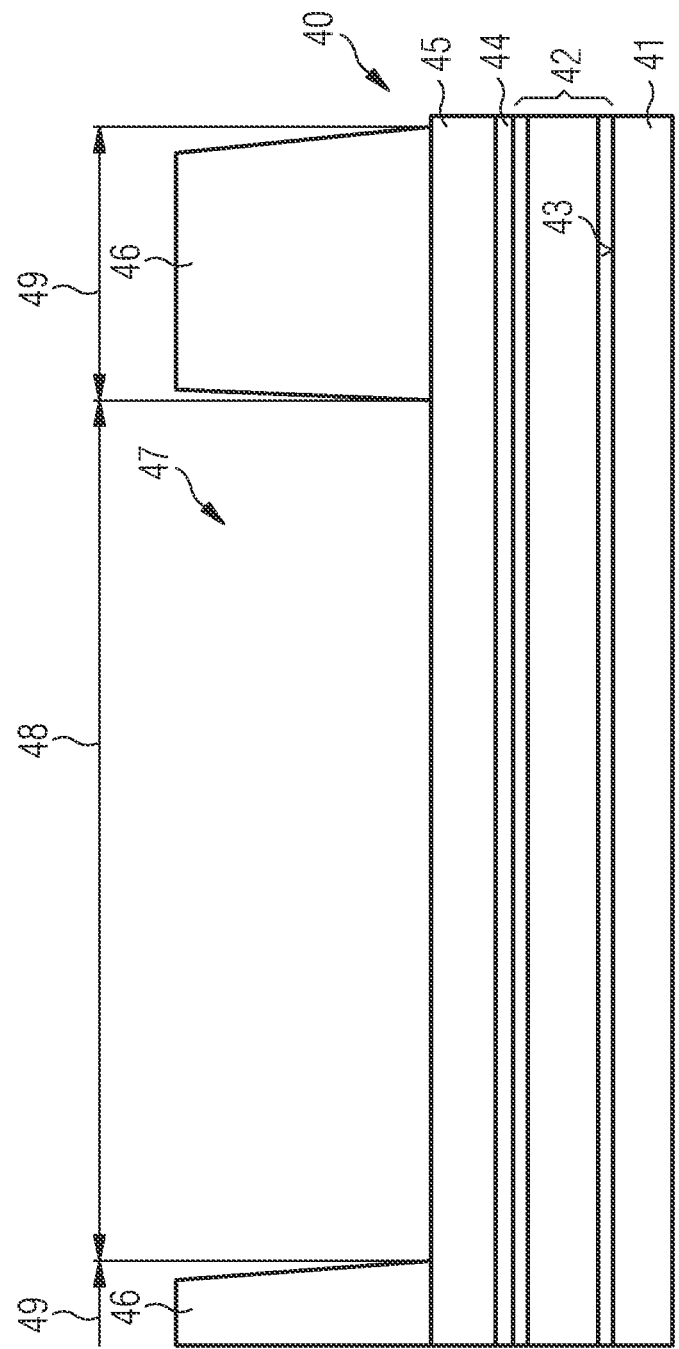
FIG. 4 illustrates a structured mask on the sacrificial layer.

FIG. 4 illustrates the application of a structured mask 46 on the insulating layer 45 which includes openings 47 above portions of the underlying oxide layer 45 which are to be removed. The mask 46 covers portions of the underlying insulating layer 45, passivation layer 44 and Group III nitride semiconductor structure 42 at positions in which a protruding region or mesa is to be formed on the upper surface 43 of the substrate 41. These positions may be termed device regions 49 and the remaining regions may be termed passive regions 48. The mask 46 may include a photosensitive material so that a structured mask 46 can be formed by photolithographic techniques.

Figure 5:
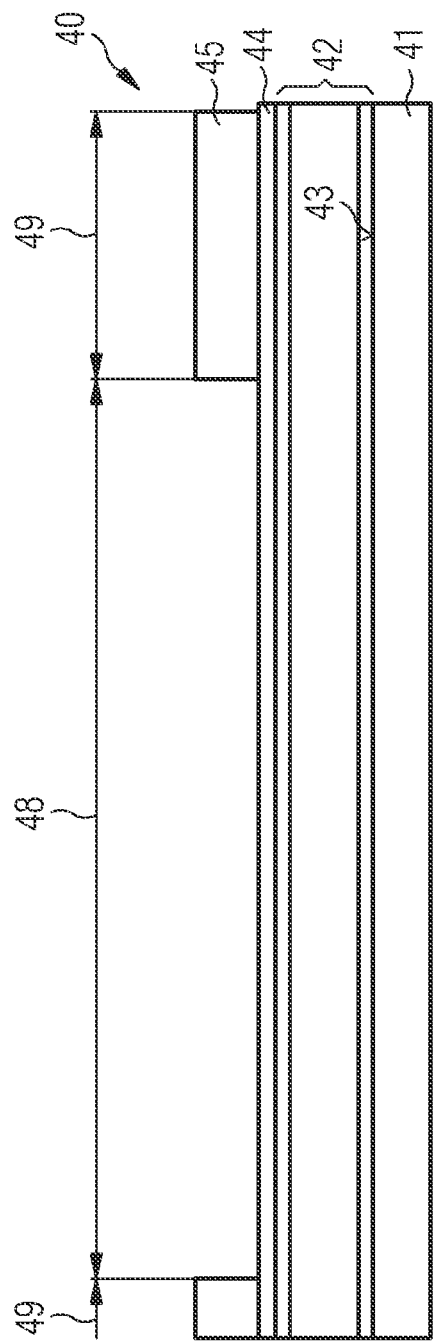
FIG. 5 illustrates the substrate after removal of portions of the sacrificial layer.

FIG. 5 illustrates the semiconductor wafer 40 after removal of the portion of the oxide layer 45 uncovered in the base of the opening 47 in the passive region 48 such that the oxide layer 45 remains in device regions 49 of the substrate 40. In the passive region 48, the passivation layer 44 forms the uppermost surface whereas in the device regions 49 the insulating layer 45 forms the uppermost surface.

Figure 6:
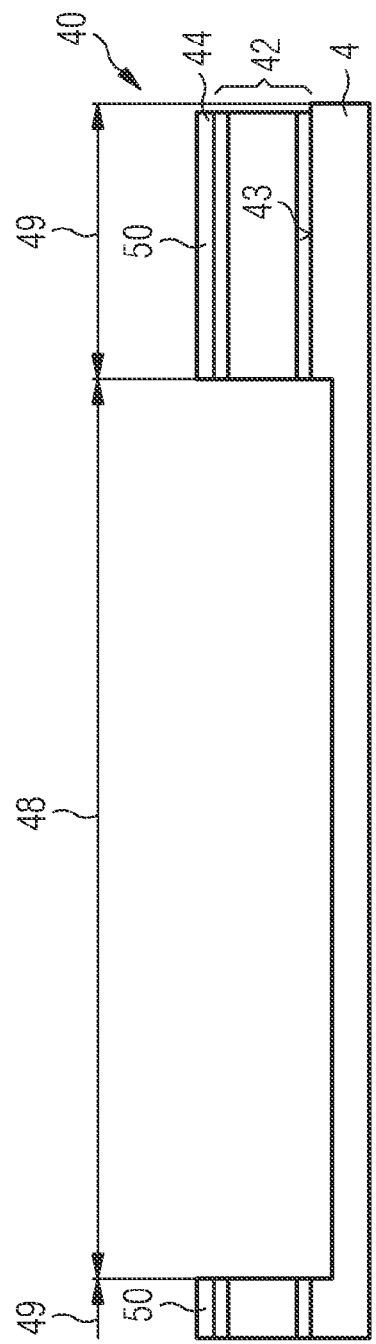
FIG. 6 illustrates the substrate after removal of the portions of the semiconductor structure from the substrate and of the sacrificial layer from remaining portions of semiconductor structure to form semiconductor mesas on the substrate.

The remaining portions of the insulating layer 45 may be used as a mask during the removal of the passivation layer 44 and semiconductor structure 42 in the passive regions 48 and subsequently removed, as is illustrated in FIG. 6.

As a result, the semiconductor wafer 40 includes a protruding region or mesa 50 on the upper surface 43 of the substrate 43 in the device regions 49. The mesa 50 includes the semiconductor structure 42 and passivation layer 44. The mesas 50 are laterally spaced apart from one another by regions of the substrate 41 in the passive regions 48.

In some embodiments, a portion of the surface 43 of the substrate 41 is also removed in the passive regions 48 such that the remaining portions of the semiconductor structure 42 and passivation layer 44 in the device regions 49 are positioned on a raised region of the substrate 41.

The mesas 50 may have a height in the range of 1 µm to 10 µm and have lateral dimensions suitable for forming a semiconductor device or active region of a semiconductor device.

In some embodiments, it is desirable that the outermost surface of the semiconductor wafer 40 is planarised, for example to further process the semiconductor structure 42 of the mesas 50, for example to apply a metallisation structure.

Figure 7:
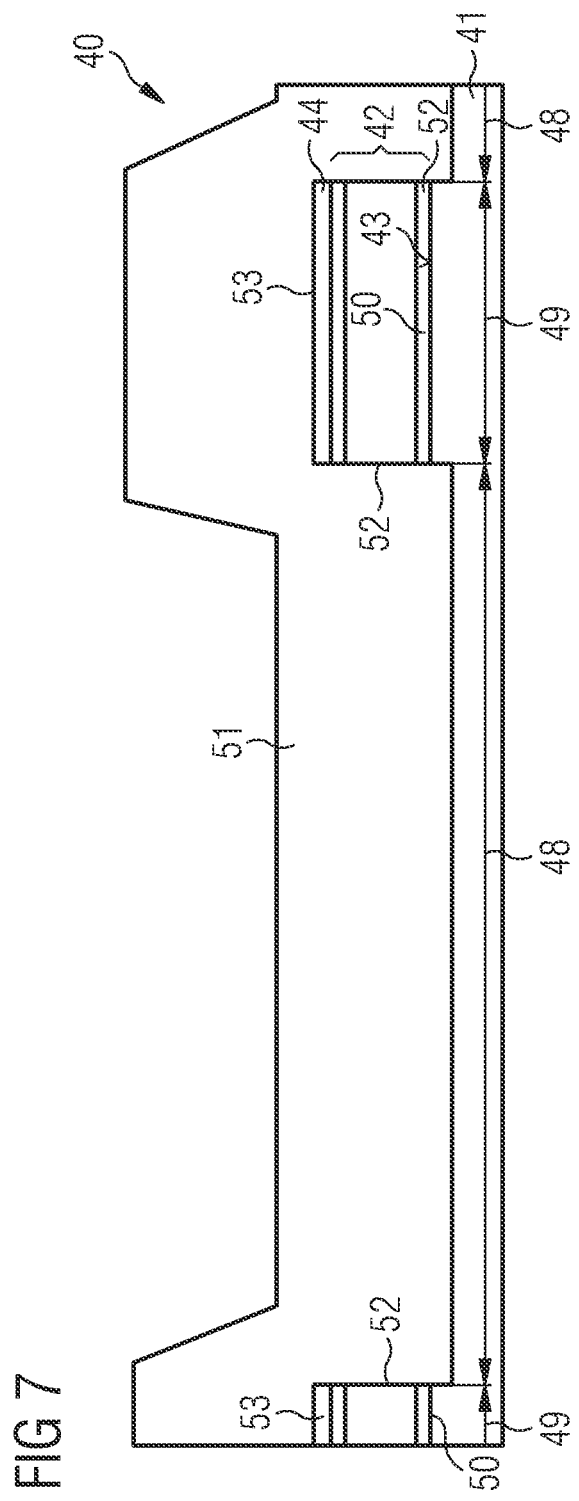
FIG. 7 illustrates an insulating layer on the substrate and mesas.
Figure 8:
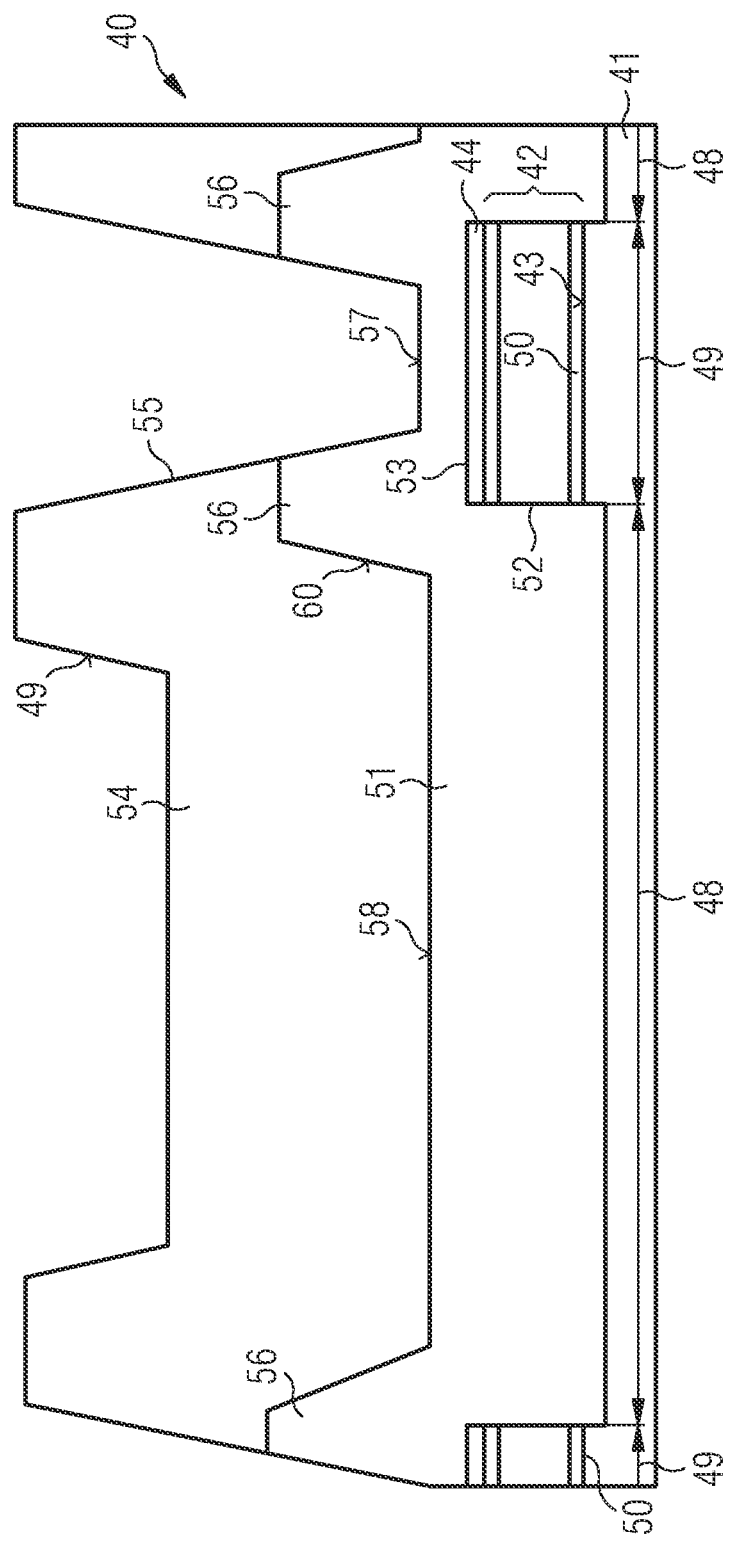
FIG. 8 illustrates a structured mask on the oxide layer and partial removal of the insulating layer above the mesas.
Figure 9:
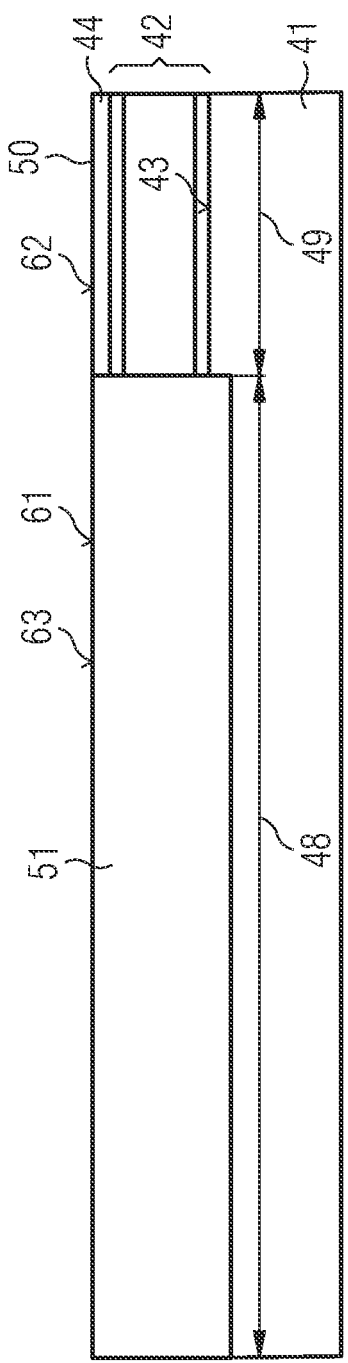
FIG. 9 illustrates the semiconductor substrate after planarization of the insulating layer and the mesas.

FIGS. 7 to 9 illustrate embodiments of a method for planarising the arrangement illustrated in FIG. 6.

FIG. 7 illustrates the semiconductor wafer 40 after the deposition of an insulating layer 51 onto the upper surface of the substrate 41 in the passive regions 48, over the side faces 52 and upper surface 53 of the mesas 50. The insulating layer 51 is substantially conformally deposited such that it includes a raised portion above the upper surface 53 and side faces 52 of the mesas 50.

FIG. 8 illustrates a structured mask 54 arranged on the insulating layer 51 which has an opening 55 above each of the mesas 50. The opening 55 has a lateral area which is less than the lateral area of the upper surface 53 of the mesa 50 such that the peripheral regions and edges of the mesa 50 are covered by the material of the mask 54.

A portion of the insulating layer 51 is removed through the opening 55 to reduce the thickness of the insulating layer 51 at the base of the opening 55 such that the upper surface 53 of mesa 50 remains covered by material of the insulating layer 51. The upper surface 57 of the remaining portion of the first layer 51 within the opening 55 may be substantially coplanar with the upper surface 58 of the insulating layer 51 in the passive region 48.

The insulation layer 51 includes a protrusion 56 which is positioned above the side faces 52 and extends into regions either side of the side faces 52 of the mesa 50 and onto the upper surface 53 of the mesa 50. The protruding region 56 of the insulating layer 51 is positioned in the peripheral region of the device region 48 and the peripheral region of the mesa 50 and surrounds the interfaces between the passive regions 48 and device regions 49.

The mask 54 is removed, for example by an ashing process, and the outermost surface 60 of the insulating layer 51 is progressively removed, for example by chemical mechanical polishing, to produce a planarised surface 63 in which the upper surface 61 of the first layer 51 in the passive regions 48 and the upper surface 62 of the mesa 50 in the device regions 49 are substantially coplanar, as is illustrated in FIG. 9.

In embodiments in which a passivation layer 44 is formed on the semiconductor structure 42, the upper surface 63 of the semiconductor wafer 40 includes only insulating and dielectric material and no semiconductor material and consequently includes protection for the underlying semiconductor structure 42. The semiconductor wafer 40 includes a layer on its upper surface which includes a majority of insulating material in which isolated and discrete regions of the semiconductor structure 42 are arranged.

Figure 10:
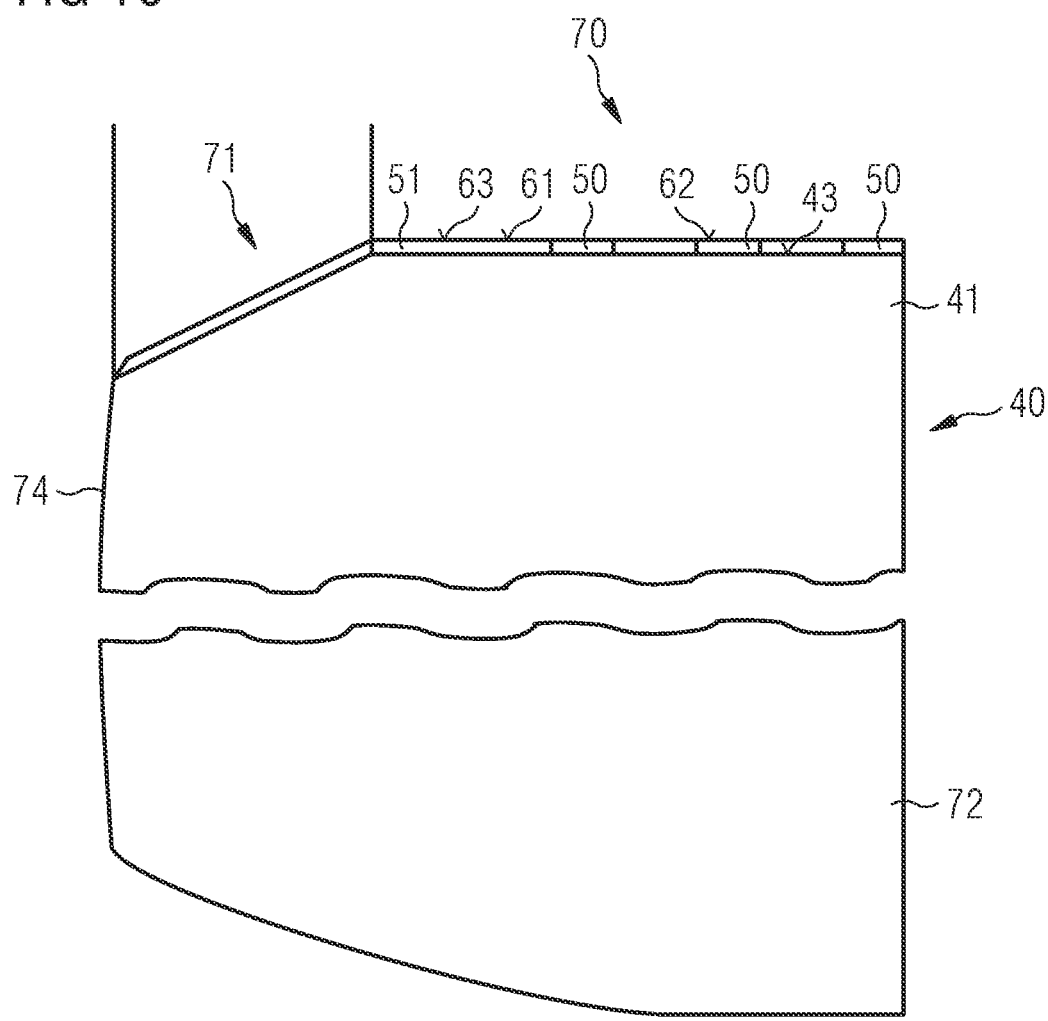
FIG. 10 illustrates a cross-sectional view of a semiconductor wafer edge region including a planarised surface.

FIG. 10 illustrates a cross-sectional view of a portion of the semiconductor wafer 40 having a planarised surface 63, in particular a wafer edge region. The semiconductor wafer 40 includes the substrate 41 in the form of a wafer having a planar device surface region 70 in the centre of its upper surface 43 which is surrounded by a peripheral region 71. The peripheral region 71 includes a bevel which extends at an inclined angle towards the opposing rear surface 72 of the substrate wafer 41 to an edge surface 74 which extends substantially perpendicularly to the device surface region 70. The substrate wafer 41 may have an upper surface in the device surface region 70 which is capable of supporting the epitaxial growth of one or more Group III nitride layers. The substrate wafer 41 may include a <100> silicon wafer, a <111> silicon wafer, a sapphire wafer or silicon carbide.

A plurality of mesas 50 including a Group III nitride-based semiconductor structure 42 are arranged on the upper surface 43 of the substrate wafer 41 in the device surface region 70. The wafer 40 also includes the insulating layer 51 which is arranged on the device surface region 70 and on the peripheral region 71 which has an upper surface 61 which is substantially coplanar with an upper surface 62 of the mesas 50 in the device surface region 70.

The wafer 40 includes a highly planar frontside surface 63 includes regions of the insulating layer 51, for example silicon dioxide, and regions of passivation layer 44 while the wafer bevel 71 includes silicon or silicon dioxide, for example, only. This arrangement may be used to avoid possible contamination of the processing equipment by elements such as gallium and aluminium, since these elements are not present on in the peripheral region 71 which may be subject to mechanical handling during subsequent processing.

The method of producing the planarised surface 63 allows a surface planarity variation of less than ±10% of the mesa height over a wafer diameter of 200 mm, also for mesas having height of 0.5 µm to 10 µm.

In the illustrated embodiment, the mesas 50 have the form of discrete protrusions which are spaced apart from one another by regions of the insulating layer 51. However, in other embodiments, the protruding structures providing mesas for semiconductor devices may be connected to neighbouring protruding regions by portions of including one or more Group III nitride layers.

One or more Group III nitride epitaxially grown over the entire surface of a wafer, such as a single crystal silicon wafer, may result in bowing of the wafer due to the highly compressive or tensile individual epitaxial Group III nitride layer(s) and due to the high in-plane lattice mismatch and difference in thermal coefficient of expansion between the Group III nitride layer and the substrate. Wafer bow values of up to 200 μm at the centre for a 200 mm wafer may occur. As a consequence, these wafers may exhibit fragility during processing in a semiconductor production line.

However, the majority of the material arranged on the upper surface 43 of the semiconductor wafer 40 includes insulating material rather than epitaxially deposited Group III nitride layers. The total area occupied by the Group III nitride containing regions 50 on the upper surface 63 the substrate wafer 41 may lie within 10% to 90% of the total area of the wafer 40. Consequently, this arrangement may be used to decrease any bow of the semiconductor wafer 40 in order to assists in the automatic handling of the semiconductor wafer 40 in subsequent processing steps.

The wafer 40 may have a wafer bow b of less than 200 μm, wherein $$100*t*b/d^2 \leq 15$$

wherein d is wafer diameter, t is thickness of the epitaxially deposited Group III nitride layers and b is wafer bow at centre of the wafer. The diameter d may be 200 mm and the thickness t may be 1 μm to 10 μm. A wafer of 200 mm diameter may have a thickness of around 725 μm.

Figure 11:
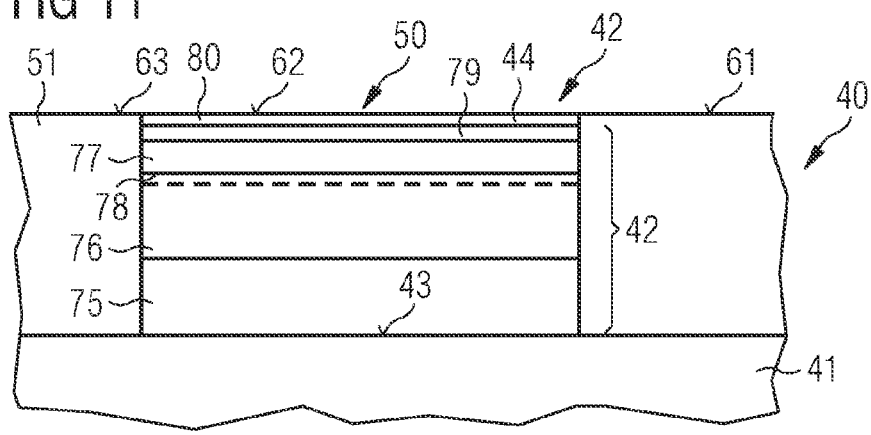
FIG. 11 illustrates an enlarged view of the semiconductor wafer of FIG. 10.

FIG. 11 illustrates an enlarged view of a portion of the upper surface 43 of the substrate wafer 40 and illustrates the structure of the mesas 50 in more detail. The semiconductor structure 42 includes a transition or buffer structure 75 including one or more Group III nitride layers which are epitaxially deposited on the upper surface 43 in the device surface region 70 of the substrate 41. The transition structure 75 may include a buffer layer arranged on the upper surface 43 and a superlattice structure including alternating Group III nitride layers of different bandgap. The semiconductor structure 42 may include a channel layer 76 arranged on the barrier structure 75 and a barrier layer 77 arranged on the channel layer 76.

The channel layer 76 and the barrier layer 77 include Group III nitride compounds of differing bandgap such that a two-dimensional charge gas is formed at the interface 78 between the channel layer 76 and the barrier layer 77 by induced and spontaneous polarization. The channel layer 76 may include gallium nitride and the barrier layer 77 may include an aluminium gallium nitride. One or more further layers 79 such as a cap layer including gallium nitride may be arranged on the barrier layer 77. A passivation layer 80 may be formed the outermost surface of the mesa 50. The passivation layer 80 may include silicon nitride, for example, and may provide the stop layer 43. The upper surface 62 of the mesa 50 provided by the passivation layer 80 is substantially coplanar with upper surface 61 of the insulating layer 51 surrounding the mesa 50 to form the planarised surface 63.

The wafer 40 may be subsequently processed to deposit a metallization structure onto the mesas 50 to form the transistor devices.

Figure 12:
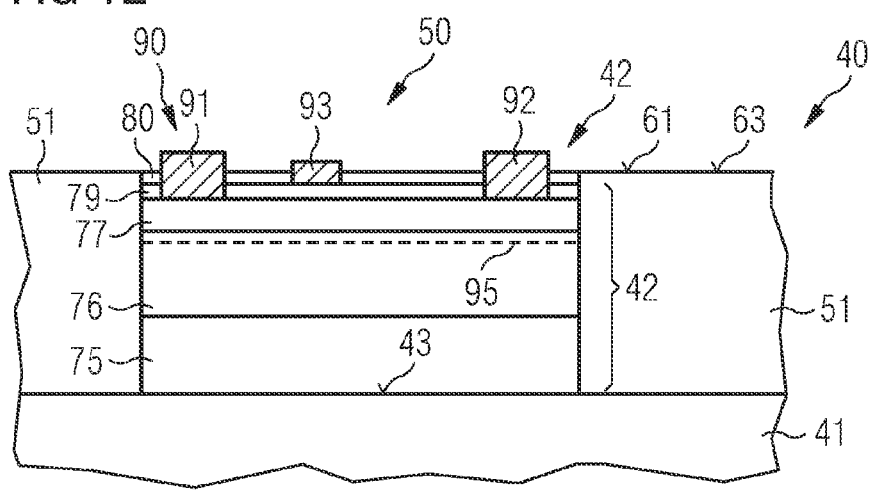
FIG. 12 illustrates an enlarged view of the semiconductor wafer after further processing to deposit a metallization structure and form a depletion mode transistor device.
Figure 13:
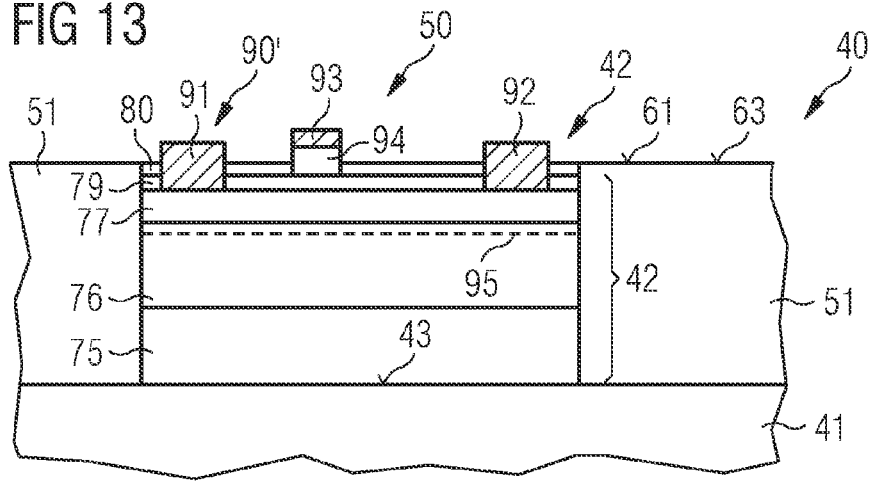
FIG. 13 illustrates an enlarged view of the semiconductor wafer after further processing to deposit a metallization structure and form an enhancement mode transistor device.

FIGS. 12 and 13 illustrate a cross-sectional view of a portion of the semiconductor wafer 40 after further processing to deposit a metallization structure and form a Group III nitride-based transistor device in the form of a HEMT (High Electron Mobility Transistor).

In FIG. 12, the HEMT 90 is a depletion mode device which is normally on. The HEMT 90 may include the buffer structure 75, Group III nitride channel layer 76 including GaN and the Group III nitride barrier layer 77 including aluminium gallium nitride ($Al_xGa_{1-x}N$ where $0<x<1$) arranged on the channel layer 76. A metal source 91, metal drain 92 and metal gate 93 are arranged on the Group III nitride barrier layer 77. The metal gate 93 forms a Schottky barrier contact and the source 92 and drain 92 form an ohmic metal contact.

A two-dimensional charge gas such as a two-dimensional electron gas (2DEG) may be formed by piezoelectric and spontaneous polarization at the interface between the channel layer 76 and the barrier layer 77 as is indicated by the dashed line 95. The HEMT 90 may have a breakdown voltage of at least 200V.

FIG. 13 illustrates a cross-sectional view of a portion of the semiconductor wafer 40 after further processing to deposit a metallization structure and form a Group III nitride-based transistor device in the form of an enhancement mode HEMT 90'.

The HEMT 90' may include the buffer structure 75, Group III nitride channel layer 76 including GaN and the Group III nitride barrier layer 77 including aluminium gallium nitride ($Al_xGa_{1-x}N$ where $0<x<1$) arranged on the channel layer 76. A metal source 91, metal drain 92 and metal gate 93 are arranged on the Group III nitride barrier layer 77. In this embodiment, a further p-doped Group III nitride layer 94 is arranged between the gate 93 and the Group III nitride barrier layer 77. The p-doped Group III nitride layer 94 may include magnesium-doped GaN. In the structure of the HEMT 90', the p-doped Group III nitride layer 94 has a defined lateral extent and height. The p-doped Group III nitride layer 94 under the gate 93 may be used to form an enhancement mode device which is normally off. In other non-illustrated embodiments, a recessed gate structure may be used to form an enhancement mode device.

A two-dimensional charge gas such as a two-dimensional electron gas (2DEG) may be formed by piezoelectric and spontaneous polarization at the interface between the channel layer 76 and the barrier layer 77 as is indicated by the dashed line 95. The HEMT 90' may be a high-voltage device, for example have a blocking voltage capability of at least 600V.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of planarising a surface, the method comprising:
    applying a first layer to a surface comprising a protruding semiconductor region such that the first layer covers the surface and the protruding semiconductor region;
    removing a portion of the first layer above the protruding semiconductor region and forming an indentation in the first layer above the protruding semiconductor region, the protruding semiconductor region remaining covered by material of the first layer; and
    progressively removing an outermost surface of the first layer to produce a planarised surface so that an upper surface of the protruding semiconductor region underlying the first layer is revealed.

2. The method of claim 1, wherein the outermost surface of the first layer is progressively removed by chemical mechanical polishing.

3. The method of claim 1, wherein an initial thickness of the first layer above the protruding semiconductor region is reduced by 80% to 90% to form the indentation.

4. The method of claim 1, further comprising:
    forming a structured mask on the first layer having an opening above the protruding semiconductor region, the opening having a lateral area smaller than a lateral area of the protruding semiconductor region;
    removing a portion of the first layer within the opening to form the indentation in the first layer; and
    removing the mask.

5. The method of claim 4, wherein the first layer and the structured mask provide a protrusion at edges of the protruding semiconductor region.

6. A method of fabricating a semiconductor wafer, the method comprising:
    depositing an insulating layer onto a substrate comprising at least one mesa comprising at least one Group III nitride such that an upper surface of the substrate and the mesa are covered with the insulating layer;
    forming a structured mask on the insulating layer having an opening above the mesa, the opening having a lateral area smaller than a lateral area of the mesa;
    removing a portion of the insulating layer within the opening and reducing a thickness of the insulating layer arranged above the mesa; and
    removing the mask and portions of the insulating layer to produce a planarised surface comprising a surface of the mesa and a surface of the insulating layer.

7. The method of claim 6, further comprising forming the at least one mesa comprising the at least one Group III nitride by removing regions of a layer comprising at least one Group-III nitride arranged on the substrate.

8. The method of claim 7, wherein removing regions of the layer comprising at least one Group III nitride further comprises exposing a surface of the substrate.

9. The method of claim 7, further comprising:
    applying a stop layer onto the at least one Group III nitride;
    applying a sacrificial layer onto the stop layer;
    applying a structured mask to the sacrificial layer having openings; and
    removing the sacrificial layer in the openings to expose discrete areas of the stop layer.

10. The method of claim 9, further comprising removing portions of the stop layer and the at least one Group III nitride in regions uncovered by the sacrificial layer to form at least one mesa on a surface of the substrate.

11. The method of claim 6, wherein removing the mask and reducing the thickness of the insulating layer comprises progressively removing the insulating layer by chemical mechanical polishing.

12. The method of claim 6, wherein removing the portion of the insulating layer within the opening comprises forming an indentation in the insulating layer with the insulating layer covering the mesa.

13. The method of claim 6, wherein the insulating layer and the structured mask provide a protrusion above edges of the mesa.

* * * * *